(12) United States Patent
Shang et al.

(10) Patent No.: US 12,308,315 B2
(45) Date of Patent: May 20, 2025

(54) FUSE COMPONENT AND SEMICONDUCTOR DEVICE

(71) Applicant: NANYA TECHNOLOGY CORPORATION, New Taipei (TW)

(72) Inventors: Kai-Po Shang, Taoyuan (TW); Jui-Hsiu Jao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 522 days.

(21) Appl. No.: 17/543,256

(22) Filed: Dec. 6, 2021

(65) Prior Publication Data

US 2023/0178482 A1    Jun. 8, 2023

(51) Int. Cl.
*H01L 23/525* (2006.01)
*H10B 20/20* (2023.01)
*H10B 20/25* (2023.01)
*H10D 64/27* (2025.01)

(52) U.S. Cl.
CPC ...... *H01L 23/5252* (2013.01); *H01L 23/5256* (2013.01); *H10B 20/20* (2023.02); *H10B 20/25* (2023.02); *H10D 64/513* (2025.01)

(58) Field of Classification Search
CPC ............. H01L 23/5252; H01L 23/5256; H01L 29/4236; H10B 20/25; H10D 64/513
See application file for complete search history.

(56) References Cited

U.S. PATENT DOCUMENTS

| | | | |
|---|---|---|---|
| 8,227,870 B2 | 7/2012 | Chudzik et al. | |
| 9,524,962 B2 | 12/2016 | Sidelnicov et al. | |
| 2004/0041233 A1* | 3/2004 | Porter | H01L 23/5252 257/530 |
| 2010/0308407 A1* | 12/2010 | Kreipl | H10B 20/00 257/356 |
| 2015/0303191 A1* | 10/2015 | Feng | H10D 1/047 438/243 |
| 2016/0300843 A1* | 10/2016 | Jung | G11C 17/18 |
| 2020/0212049 A1 | 7/2020 | Lin | |
| 2022/0085034 A1 | 3/2022 | Lin | |
| 2023/0125837 A1 | 4/2023 | Shang et al. | |
| 2023/0130975 A1 | 4/2023 | Shang et al. | |

(Continued)

FOREIGN PATENT DOCUMENTS

| TW | I634559 B | 9/2018 |
|---|---|---|
| TW | I717685 B | 2/2021 |

OTHER PUBLICATIONS

Taiwanese Office Action dated Jun. 14, 2023 in application No. 111104570 and the search report attached to the Office Action; pp. 1-7.

*Primary Examiner* — Aaron J Gray
(74) *Attorney, Agent, or Firm* — MUNCY, GEISSLER, OLDS & LOWE, P.C.

(57) ABSTRACT

A fuse component and a semiconductor device and a semiconductor device having the fuse component are provided. The fuse component includes an active region having a surface, a first fuse dielectric layer extending from the surface of the active region into the active region, a first gate metal layer surrounded by the first fuse dielectric layer, a second fuse dielectric layer extending from the surface of the active region into the active region, and a second gate metal layer surrounded by the second fuse dielectric layer. The first gate metal layer is electrically connected with the second gate metal layer.

13 Claims, 14 Drawing Sheets

(56) References Cited

U.S. PATENT DOCUMENTS

2023/0178481 A1   6/2023  Shang et al.
2023/0178482 A1   6/2023  Shang et al.
2023/0343883 A1  10/2023  Yang et al.

* cited by examiner

FUSE COMPONENT AND SEMICONDUCTOR DEVICE

TECHNICAL FIELD

The present disclosure relates to a fuse component and a semiconductor device having the fuse component, and more particularly, to a fuse component having a three-dimensional (3D) structure and a semiconductor device having the fuse component.

DISCUSSION OF THE BACKGROUND

Fuses and antifuses are widely used in the fabrication of semiconductor devices, such as dynamic random access memory (DRAM) or other memory devices for fault tolerance, or used as programmable links in programmable circuits. For example, a circuit path that is initially conductive can be broken or cut off by activating (e.g., blowing, melting, etc.) a fuse. Conversely, a non-conductive circuit path may become a short circuit by activating (e.g., through breakdown, metal diffusion, transformation of properties, etc.) an antifuse.

However, antifuses may occupy a large area of semiconductor substrates. As the semiconductor devices become more highly integrated, antifuses with favorable size and breakdown conditions are required.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a fuse component. The fuse component includes an active region having a surface, a first fuse dielectric layer extending from the surface of the active region into the active region, a first gate metal layer surrounded by the first fuse dielectric layer, a second fuse dielectric layer extending from the surface of the active region into the active region, and a second gate metal layer surrounded by the second fuse dielectric layer. The first gate metal layer is electrically connected with the second gate metal layer.

Another aspect of the present disclosure provides a semiconductor device. The semiconductor device includes an active region, a first fuse dielectric layer disposed in the active region, a first gate metal layer disposed in the active region and surrounded by the first fuse dielectric layer, a second fuse dielectric layer disposed in the active region, and a second gate metal layer disposed in the active region and surrounded by the second fuse dielectric layer. The first gate metal layer and the second gate metal layer are configured to receive a voltage to change a resistivity between the first gate metal layer and the active region.

Another aspect of the present disclosure provides a method of manufacturing a fuse component. The method includes providing an active region, forming a first recess region and a second recess region in the active region, disposing a fuse dielectric material in the first recess region and the second recess region, and filling the first recess region and the second recess region with a gate metal material.

By forming a fuse component having a three-dimensional (3D) structure, the area consumption of the fuse component of the present disclosure is increasingly reduced. In addition, by electrically connecting at least two fuse components of the present disclosure, the probability of successfully fusing the fuse components can be increased.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
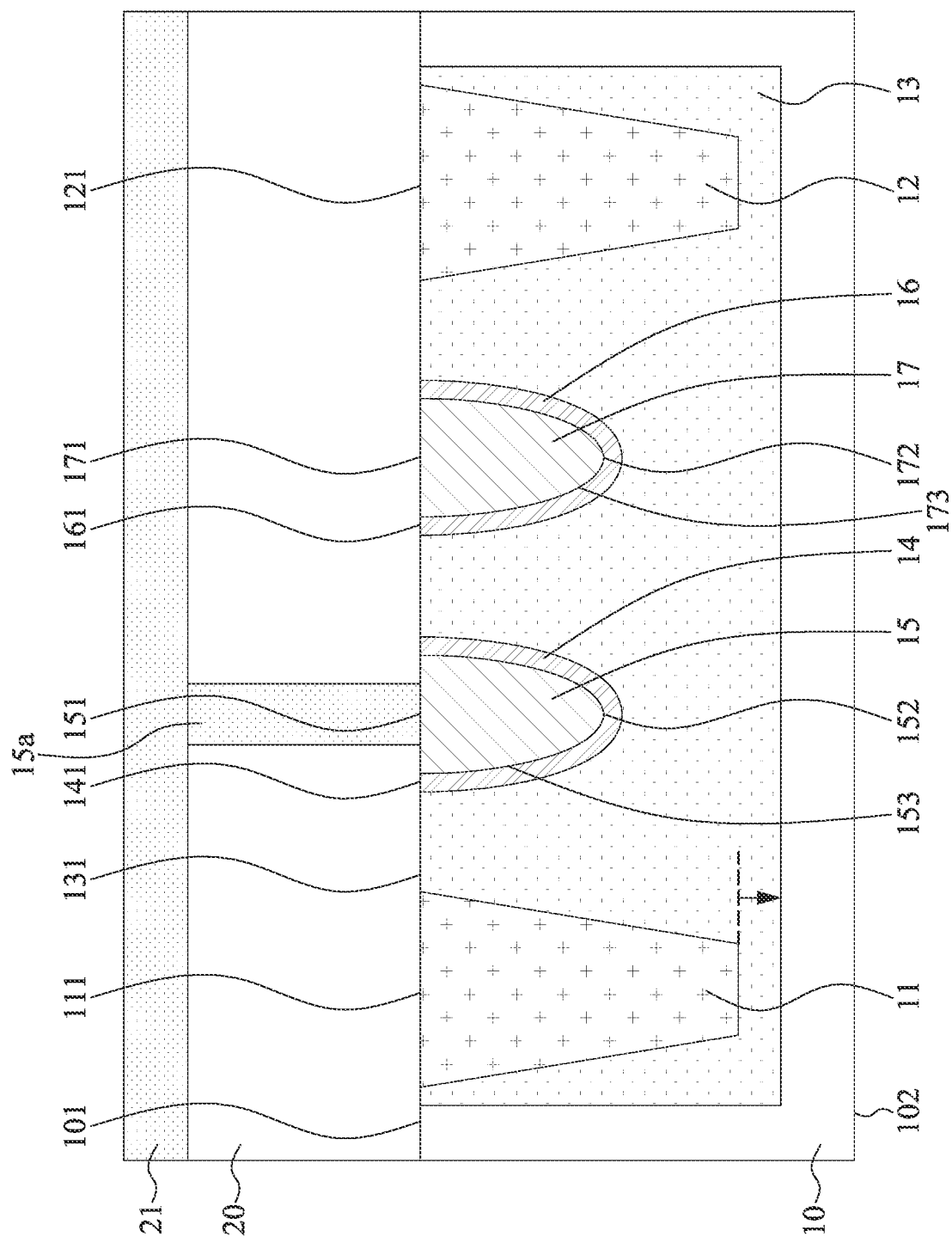
FIG. 1 is a schematic cross-sectional view of a semiconductor device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic cross-sectional view of a semiconductor device 1 in accordance with some embodiments of the present disclosure.

In some embodiments, the semiconductor device 1 may be disposed adjacent to a circuit. For example, the semiconductor device 1 may be disposed adjacent to a memory device such as a dynamic random access memory (DRAM) device or the like. In some embodiments, the semiconductor device 1 may include a fuse array structure or be a part of the fuse array structure. In some embodiments, the semiconductor device 1 may include a fuse component. As used herein, the term "fuse component" refers to a semiconductor device functioning as an antifuse, which is a normally an open circuit that can be blown to become a short circuit when a voltage is applied.

As shown in FIG. 1, in some embodiments, the semiconductor device 1 may include a substrate 10, isolation structures 11, 12, an active region 13, fuse dielectric layers 14, 16, gate metal layers 15, 17, an interlayer dielectric layer 20, a conductive plug 15a, and a conductive layer 21.

In some embodiments, the substrate 10 may include a surface 101 and a surface 102 opposite to the surface 101. In some embodiments, the surface 101 may be an active surface of the substrate 10 and the surface 102 may be a backside surface of the substrate 10.

In some embodiments, the substrate 10 may include, for example, silicon (Si), germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials. In some other embodiments, the substrate 10 may include a layered semiconductor such as silicon/silicon germanium, silicon-on-insulator, or silicon germanium-on-insulator.

In some embodiments, the isolation structures 11 and 12 may be disposed over or in the substrate 10. In some embodiments, the isolation structures 11 and 12 may be disposed in the active region 13. In some embodiments, the isolation structures 11 and 12 may include shallow trench isolation (STI) structures.

In some embodiments, the isolation structure 11 may have a surface (or a top surface) 111 substantially coplanar with the surface 101 of the substrate 10. Similarly, the isolation structure 12 may have a surface (or a top surface) 121 substantially coplanar with the surface 101 of the substrate 10. In some embodiments, the surface 111 and the surface 121 may be exposed from the substrate 10 (such as exposed from the surface 101 of substrate 10). In some embodiments, the surface 111 and the surface 121 may be exposed from the active region 13 (such as exposed from a surface 131 of the active region 13).

In some embodiments, the isolation structures 11 and 12 may each include an insulating material such as silicon oxide ($SiO_2$), silicon nitride ($Si_3N_4$), silicon oxynitride ($N_2OSi_2$), silicon nitride oxide ($N_2OSi_2$), or fluorine-doped silica. In some embodiments, the isolation structures 11 and 12 may define one or more active areas or active regions of the substrate 10.

In some embodiments, the active region 13 may be disposed over or in the substrate 10. In some embodiments, the active region 13 may be disposed over or proximal to the surface 101 of the substrate 10. In some embodiments, the active region 13 may have a surface (or a top surface) 131 exposed from the surface 101 of the substrate 10. In some embodiments, the surface 131 of the active region 13 may be substantially coplanar with the surface 101 of the substrate 10. In some embodiments, the active region 13 may be disposed between the isolation structures 11 and 12. For example, a part of the active region 13 may be disposed between the isolation structures 11 and 12.

In some embodiments, the active region 13 may be doped with an N-type dopant such as phosphorus (P), arsenic (As), or antimony (Sb). In some other embodiments, the doped region 13 may be doped with a P-type dopant such as boron (B) or indium (In). In some embodiments, the substrate 10 may be or include an unimplanted area. In some embodiments, the active region 13 may have a higher doping concentration than the substrate 10.

In some embodiments, the active region 13 may include a substantially constant doping concentration. For example, the fuse dielectric layer 14 may be surrounded by the active region 13 with a substantially constant or uniform doping concentration. For example, the fuse dielectric layer 16 may be surrounded by the active region 13 with a substantially constant or uniform doping concentration.

In some embodiments, a doping concentration of the active region 13 between the isolation structure 11 and the fuse dielectric layer 14 may be substantially constant or uniform. In some embodiments, a doping concentration of the active region 13 between the fuse dielectric layer 14 and the fuse dielectric layer 16 may be substantially constant or uniform. In some embodiments, a doping concentration of the active region 13 between the isolation structure 12 and the fuse dielectric layer 16 may be substantially constant or uniform. In other words, the doping concentration around the fuse dielectric layer 14 and/or the fuse dielectric layer 16 may be substantially constant or uniform.

In some embodiments, the active region 13 may include a step, gradient, or other doping profile. For example, the active region 13 may include a gradually changing doping concentration. For example, the doping concentration of the active region 13 may gradually decrease toward the surface 102 of the substrate 10. Therefore, in some embodiments, the fuse dielectric layer 14 and/or the fuse dielectric layer 16 may be surrounded by the active region 13 with a step, gradient, or other doping profile.

For example, in some embodiments, a doping concentration of the active region 13 between the isolation structure 11 and the fuse dielectric layer 14 may be substantially gradient. In some embodiments, a doping concentration of the active region 13 between the fuse dielectric layer 14 and the fuse dielectric layer 16 may be substantially gradient. In some embodiments, a doping concentration of the active region 13 between the isolation structure 12 and the fuse dielectric layer 16 may be substantially gradient.

According to some embodiments of the present disclosure, the active region 13, the fuse dielectric layer 14, and the gate metal layer 15 may together function as a fuse component (which may be referred to as a first fuse component). The active region 13, the fuse dielectric layer 16, and the gate metal layer 17 may together function as another fuse component (which may be referred to as a second fuse component). The first fuse component and the second fuse component may each have a structure different from a transistor, such as a metal-oxide-semiconductor field-effect transistor (MOSFET) or a metal-insulator-semiconductor field-effect transistor (MISFET).

For example, the first fuse component (or the second fuse component) may not be or include a transistor. For example, the first fuse component (or the second fuse component) may be surrounded by a doped region (such as the active region 13) with a uniform, step, gradient, or other doping profile.

For example, the first fuse component (or the second fuse component) may not have two additional terminals (i.e., a source and a drain), each connected to individual highly doped regions that are separated by the body region (such as a bulk substrate). For example, the first fuse component (or the second fuse component) may not have a depletion region extending between the source and the drain. For example, the first fuse component (or the second fuse component) may not have a conducting channel extending between the source and the drain.

In some embodiments, the fuse dielectric layer 14 may be disposed in the active region 13. In some embodiments, the fuse dielectric layer 14 may be at least partially surrounded by the active region 13. In some embodiments, the fuse dielectric layer 14 may at least partially penetrate or extend into the active region 13. In some embodiments, the fuse dielectric layer 14 may extend from the surface 131 of the active region 13 into the active region 13. In some embodiments, the active region 13 may include a recess (such as the recess region 13r1 in FIG. 8B) indented or recessed into the substrate 10, and the fuse dielectric layer 14 may be disposed in the recess.

In some embodiments, the fuse dielectric layer 14 may have a surface (or a top surface) 141 exposed from the surface 131 of the active region 13. In some embodiments, the surface 141 of the fuse dielectric layer 14 may be substantially coplanar with the surface 131 of the active region 13.

In some embodiments, the fuse dielectric layer 16 may be disposed adjacent to the fuse dielectric layer 14. In some embodiments, the fuse dielectric layer 16 may be spaced apart from the fuse dielectric layer 14. In some embodiments, the fuse dielectric layer 16 may be separated from the fuse dielectric layer 14 by the active region 13.

In some embodiments, the fuse dielectric layer 16 may be disposed in the active region 13. In some embodiments, the fuse dielectric layer 16 may be at least partially surrounded by the active region 13. In some embodiments, the fuse dielectric layer 16 may at least partially penetrate or extend into the active region 13. In some embodiments, the fuse dielectric layer 16 may extend from the surface 131 of the active region 13 into the active region 13. In some embodiments, the active region 13 may include a recess (such as the recess region 13r2 in FIG. 8B) indented or recessed into the substrate 10, and the fuse dielectric layer 16 may be disposed in the recess.

In some embodiments, the fuse dielectric layer 16 may have a surface (or a top surface) 161 exposed from the surface 131 of the active region 13. In some embodiments, the surface 161 of the fuse dielectric layer 16 may be substantially coplanar with the surface 131 of the active region 13. In some embodiments, the surface 161 of the fuse dielectric layer 16 may be substantially coplanar with the surface 141 of the fuse dielectric layer 14.

In some embodiments, the fuse dielectric layer 14 and the fuse dielectric layer 16 may each include a silicon oxide ($SiO_2$), metal oxides or the like.

In some embodiments, the fuse dielectric layer 14 and the fuse dielectric layer 16 may be formed during a manufacturing process of, for example, a gate dielectric layer of a buried-gate structure of an adjacent circuit. In such embodiments, the fuse dielectric layer 14 and the fuse dielectric layer 16 may each include a material which is the same as that of the gate dielectric layer, such as hafnium oxide ($HfO_2$), hafnium silicate ($HfSiO_4$), lanthanum oxide ($La_2O_3$), lanthanum aluminum oxide ($LaAlO_3$), zirconium oxide ($ZrO_2$), zirconium silicate ($ZrSiO_4$), aluminum oxide ($Al_2O_3$), other high-k materials, or a combination thereof.

In some embodiments, the gate metal layer 15 may be disposed in the active region 13. In some embodiments, the gate metal layer 15 may be at least partially surrounded by the fuse dielectric layer 14 and further surrounded by the active region 13. In some embodiments, the gate metal layer 15 may at least partially penetrate or extend into the fuse dielectric layer 14. In some embodiments, the gate metal layer 15 may extend from the surface 141 of the fuse dielectric layer 14 into the fuse dielectric layer 14. In some embodiments, fuse dielectric layer 14 may include a recess (such as the recess region 13r1 in FIG. 8B and FIG. 8C) indented or recessed into the substrate 10, and the gate metal layer 15 may be disposed in the recess.

In some embodiments, the gate metal layer 15 may have a surface (or a top surface) 151 facing away from the substrate 10, a surface (or a bottom surface) 152 opposite to the surface 151, and a lateral surface 153 extending between the surface 151 and the surface 152.

In some embodiments, the surface 151 of the gate metal layer 15 may be exposed from the surface 131 of the active region 13. In some embodiments, the surface 151 of the gate metal layer 15 may be substantially coplanar with the surface 131 of the active region 13. In some embodiments, the surface 151 of the gate metal layer 15 may be substantially coplanar with the surface 141 of the fuse dielectric layer 14.

In some embodiments, the surface 152 of the gate metal layer 15 may face the substrate 10. In some embodiments, the surface 152 of the gate metal layer 15 may include, but is not limited to, a bowl-shaped profile, a U-shaped profile, or another feasible profile.

In some embodiments, the surface 153 of the gate metal layer 15 may be non-parallel to or angled with the surface 101 of the substrate 10. In some embodiments, the surface 153 of the gate metal layer 15 may be non-parallel to or angled with the surface 131 of the active region 13. In some embodiments, the surface 153 of the gate metal layer 15 may be surrounded by the fuse dielectric layer 14. In some embodiments, the surface 153 of the gate metal layer 15 may be covered by the fuse dielectric layer 14. In some embodiments, the surface 153 of the gate metal layer 15 may contact (such as directly contact) the fuse dielectric layer 14.

In some embodiments, the gate metal layer 15 may be disposed adjacent to the isolation structure 11 and/or the isolation structure 12. In some embodiments, the surface 153 of the gate metal layer 15 may face the isolation structures 11 and 12.

In some embodiments, the gate metal layer 17 may be disposed adjacent to the gate metal layer 15. In some embodiments, the gate metal layer 17 may be disposed in the active region 13. In some embodiments, the gate metal layer 17 may be at least partially surrounded by the fuse dielectric layer 16 and further surrounded by the active region 13. In some embodiments, the gate metal layer 17 may at least partially penetrate or extend into the fuse dielectric layer 16. In some embodiments, the gate metal layer 17 may extend from the surface 161 of the fuse dielectric layer 16 into the fuse dielectric layer 16. In some embodiments, fuse dielectric layer 16 may include a recess (such as the recess region 13r2 in FIG. 8B and FIG. 8C) indented or recessed into the substrate 10, and the gate metal layer 17 may be disposed in the recess.

The gate metal layer 17 may have a similar structure as the gate metal layer 15. For example, the gate metal layer 17 may have a surface (or a top surface) 171 facing away from the substrate 10, a surface (or a bottom surface) 172 opposite to the surface 171, and a lateral surface 173 extending between the surface 171 and the surface 172.

In some embodiments, the surface 171 of the gate metal layer 17 may be exposed from the surface 131 of the active region 13. In some embodiments, the surface 171 of the gate metal layer 17 may be substantially coplanar with the surface 131 of the active region 13. In some embodiments, the surface 171 of the gate metal layer 17 may be substantially coplanar with the surface 161 of the fuse dielectric layer 16.

In some embodiments, the surface 172 of the gate metal layer 17 may face the substrate 10. In some embodiments, the surface 172 of the gate metal layer 17 may include, but is not limited to, a bowl-shaped profile, a U-shaped profile, or another feasible profile.

In some embodiments, the surface 173 of the gate metal layer 17 may be non-parallel to or angled with the surface 101 of the substrate 10. In some embodiments, the surface 173 of the gate metal layer 17 may be non-parallel to or angled with the surface 131 of the active region 13. In some embodiments, the surface 173 of the gate metal layer 17 may be surrounded by the fuse dielectric layer 16. In some embodiments, the surface 173 of the gate metal layer 17 may be covered by the fuse dielectric layer 16. In some embodiments, the surface 173 of the gate metal layer 17 may contact (such as directly contact) the fuse dielectric layer 16.

In some embodiments, the gate metal layer 17 may be disposed adjacent to the isolation structure 11 and/or the isolation structure 12. In some embodiments, the surface 173 of the gate metal layer 17 may face the isolation structures 11 and 12. In some embodiments, the lateral surface 173 of the gate metal layer 17 may face the lateral surface 153 of the gate metal layer 15.

In some embodiments, the gate metal layer 15 and the gate metal layer 17 may each include polycrystalline silicon (poly-Si), titanium nitride (TiN), tungsten (W), or the like. In some embodiments, the gate metal layer 15 and the gate metal layer 17 may be formed during a manufacturing process of, for example, a gate electrode of a buried-gate structure of an adjacent circuit. In such embodiments, the gate metal layer 15 and the gate metal layer 17 may each include a material which is the same as that of the gate electrode.

In some embodiments, the interlayer dielectric layer 20 may be disposed on the substrate 10 and contact a part of the surface 101 of the substrate 10. In some embodiments, the interlayer dielectric layer 20 may contact the surface 111 of the isolation structure 11 and the surface 121 of the isolation structure 12. In some embodiments, the interlayer dielectric layer 20 may contact the surface 131 of the active region 13. In some embodiments, the interlayer dielectric layer 20 may contact the surface 141 of the fuse dielectric layer 14 and/or the surface 161 of the fuse dielectric layer 16. In some embodiments, the interlayer dielectric layer 16 may contact the surface 151 of the gate metal layer 15 and/or the surface 171 of the gate metal layer 17.

In some embodiments, the interlayer dielectric layer 20 may include a suitable dielectric material. For example, the interlayer dielectric layer 20 may include silicon nitride ($Si_3N_4$), silicon oxynitride ($N_2OSi_2$), silicon nitride oxide ($N_2OSi_2$), tantalum pentoxide ($Ta_2O_5$), aluminum oxide ($Al_2O_3$), strontium bismuth tantalum oxide ($SrBi_2Ta_2O_9$, SBT), barium strontium titanate oxide ($BaSrTiO_3$, BST), or a combination thereof.

In some embodiments, the conductive plug 15a may penetrate or extend into the interlayer dielectric layer 20. In some embodiments, the conductive plug 15a may be disposed on the surface 151 of the gate metal layer 15. In some embodiments, the conductive plug 15a may be in contact with the surface 151 of the gate metal layer 15. For example, a part of the surface 151 of the gate metal layer 15 may be covered by the conductive plug 15a, and another part of the surface 151 of the gate metal layer 15 may be covered by the interlayer dielectric layer 20. In some embodiments, the conductive plug 15a may be electrically connected with the gate metal layer 15. In some embodiments, the conductive plug 15a may be electrically connected with the gate metal layer 17.

In some embodiments, the conductive plug 15a may include a suitable conductive material. For example, the conductive plug 15a may include tungsten (W), copper (Cu), aluminum (Al), silver (Ag), an alloy thereof, or a combination thereof.

In some embodiments, the conductive layer 21 may be disposed on the interlayer dielectric layer 20 and electrically connected with the conductive plug 15a.

In some embodiments, the conductive layer 21 may include a suitable conductive material. For example, the conductive layer 21 may include tungsten (W), copper (Cu), aluminum (Al), silver (Ag), an alloy thereof, or a combination thereof. In some embodiments, the conductive layer 21 and the conductive plug 15a may include the same conductive material. In some embodiments, the conductive layer 21 and the conductive plug 15a may include different conductive materials.

Figure 2:
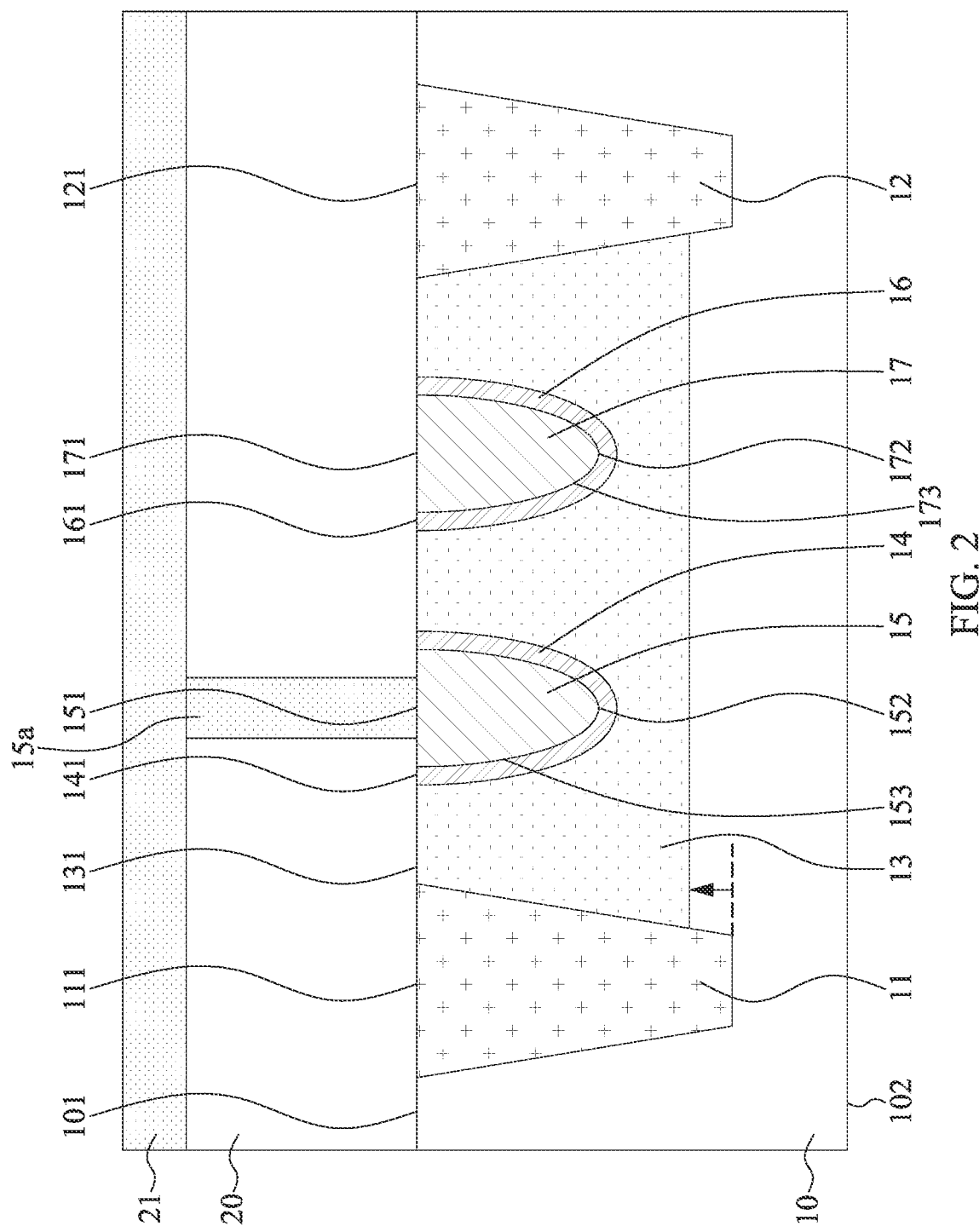
FIG. 2 is a schematic cross-sectional view of a semiconductor device in accordance with some embodiments of the present disclosure.

FIG. 2 is a schematic cross-sectional view of a semiconductor device 2 in accordance with some embodiments of the present disclosure. The semiconductor device 2 of FIG. 2 is similar to the semiconductor device 1 of FIG. 1, except for the differences described below.

In some embodiments, as shown in FIG. 1, the active region 13 may be deeper than the isolation structures 11 and 12. For example, the bottoms of the isolation structures 11 and 12 are covered or surrounded by the active region 13. However, in some other embodiments, as shown in FIG. 2, the isolation structures 11 and 12 may exceed the active region 13 and extend into the substrate 10.

In some embodiments, the doping depth of the active region 13 may be adjusted to fit the applications employing the semiconductor device 2. For example, the doping depth of the active region 13 may be shallower than the isolation structures 11 and 12 but deeper than the fuse dielectric layer 14 and the fuse dielectric layer 16 so as to cover or surround the fuse dielectric layer 14 and the fuse dielectric layer 16.

Figure 3:
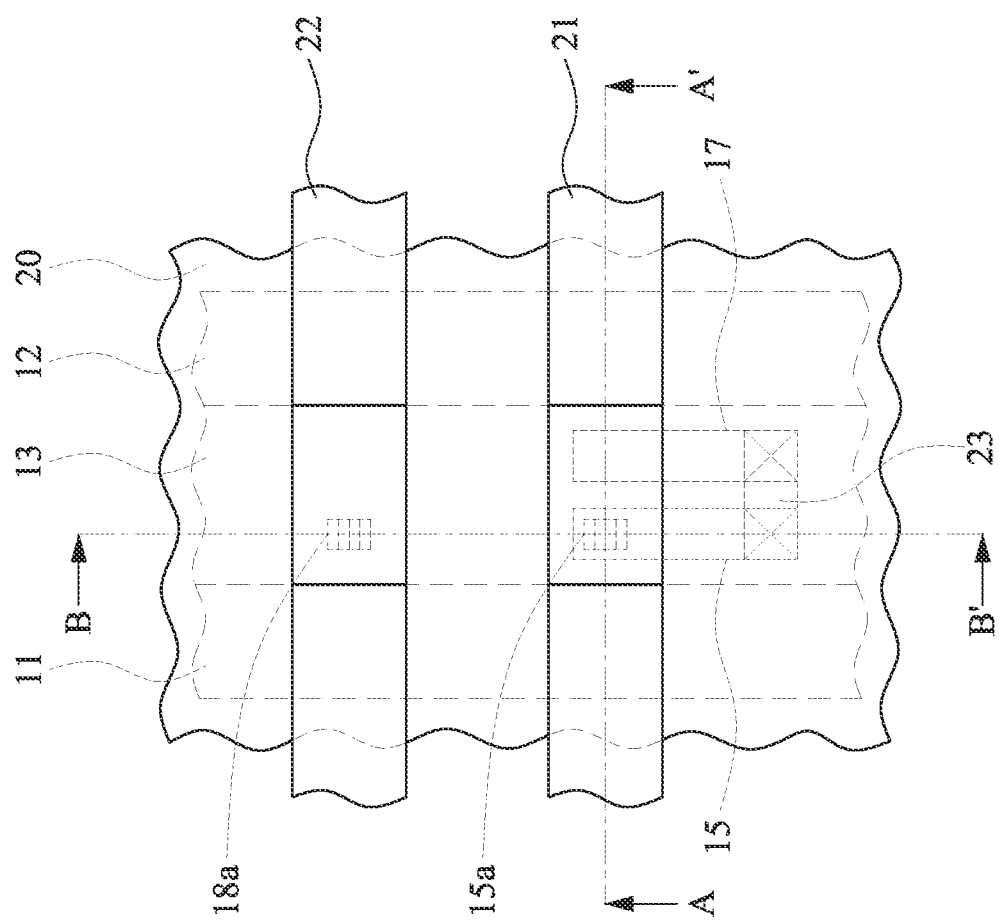
FIG. 3 illustrates a schematic top view of a semiconductor device in accordance with some embodiments of the present disclosure.

FIG. 3 illustrates a schematic top view of a semiconductor device 3 in accordance with some embodiments of the present disclosure. In some embodiments, the semiconductor device 1 of FIG. 1 and the semiconductor device 2 of FIG. 2 may be schematic cross-sectional views cutting through line AA' in FIG. 3.

As shown in FIG. 3, the isolation structures 11 and 12 may be formed as a strip-like configuration extending over the substrate (not shown in FIG. 3, such as the substrate 10 in FIG. 1) along a first direction, such as the direction Y shown in FIG. 3. Similarly, the active region 13 may be formed as a strip-like configuration extending over the substrate (not shown in FIG. 3, such as the substrate 10 in FIG. 1) along the direction Y shown in FIG. 3. The active region 13 may be disposed between the isolation structures 11 and 12.

The conductive layers 21 and 22 may be formed as a strip-like configuration extending over the interlayer dielectric layer 20 along a second direction, such as the direction X shown in FIG. 2. In some embodiments, the conductive layer 21 may be formed over the conductive plug 15a and electrically connected to the gate metal layer 15 and the gate metal layer 17. In some embodiments, the conductive layer 22 may be formed over a conductive plug 18a and electrically connected to the active region 13.

In some embodiments, the conductive plug 18a may be similar to the conductive plug 15a. In some embodiments, the conductive layer 22 may be similar to the conductive layer 21.

In some embodiments, the conductive layers 21 and 22 may be bit lines and/or word lines or be a part of bit lines and/or word lines arranged in rows and columns. In some embodiments, the bit lines and/or word lines arranged in rows and columns may be substantially orthogonally arranged. For example, the bit lines may be substantially orthogonal to the word lines. In some embodiments, the bit lines may be electrically isolated from each other. In some embodiments, the word lines may be electrically isolated from each other.

In some embodiments, the gate metal layer 15 and the gate metal layer 17 may be electrically connected through a conductive layer 23. In some embodiments, the conductive layer 23 may be spaced apart from the conductive layers 21 and 22. For example, the conductive layer 23 may be spaced apart from the conductive layer 21 in the direction Y shown in FIG. 2.

In some embodiments, the gate metal layer 15 may be electrically connected with the conductive layer 21 through the conductive plug 15a. In some embodiments, the gate metal layer 17 may be electrically connected with the conductive layer 21 through the conductive layer 23, the gate metal layer 15, and the conductive plug 15a.

Figure 4:
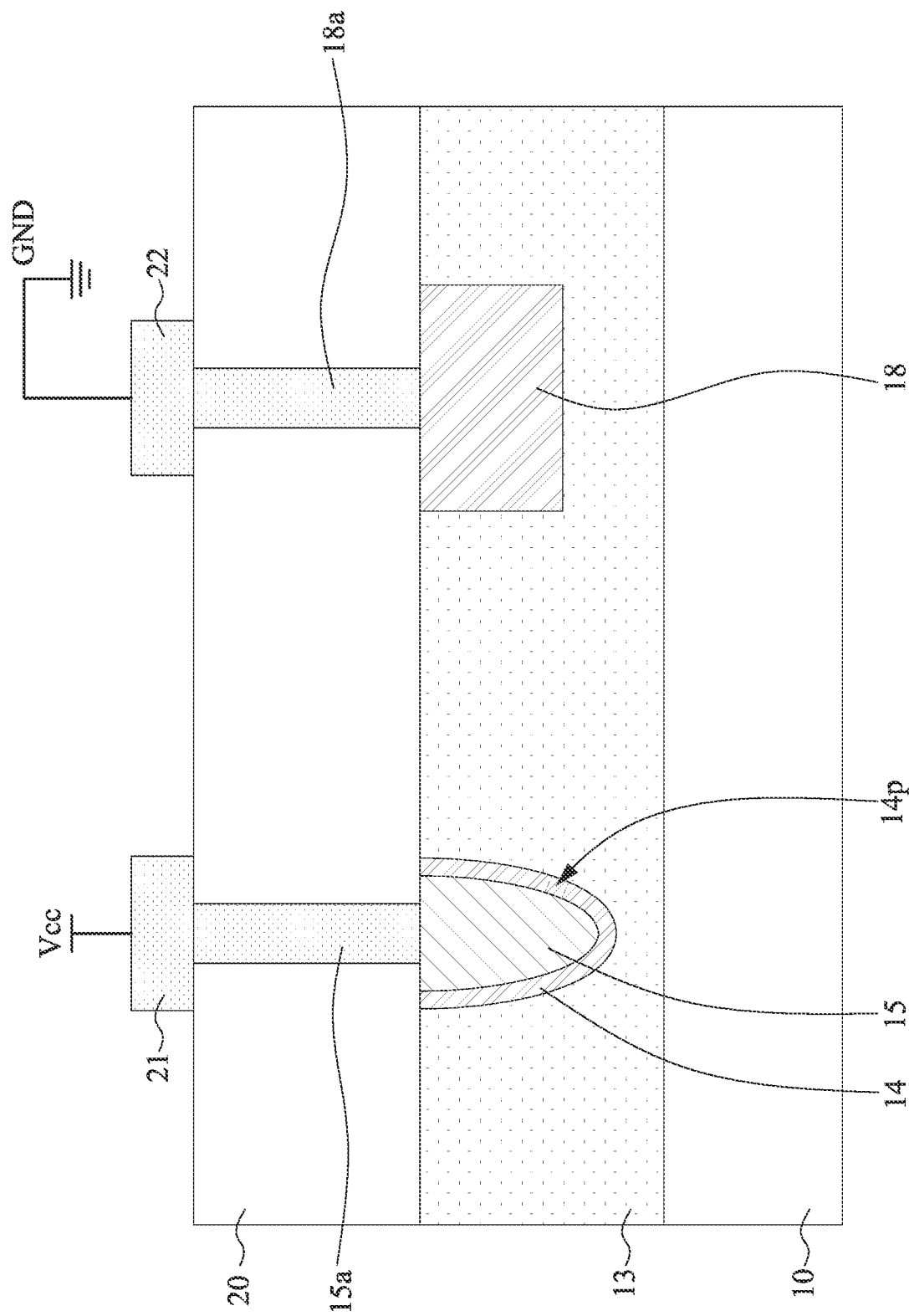
FIG. 4 is a schematic cross-sectional view of a semiconductor device in accordance with some embodiments of the present disclosure.

FIG. 4 is a schematic cross-sectional view of a semiconductor device 4 in accordance with some embodiments of the present disclosure. In some embodiments, the semiconductor device 4 of FIG. 4 may be a schematic cross-sectional view cutting through line BB' in FIG. 3.

As shown in FIG. 4, the semiconductor device 4 includes a doped region 18 in the active region 13. In some embodiments, the doped region 18 may have a depth that is less or shallower than a depth of the active region 13. For example, the doped region 18 may be located within the active region 13. In some embodiments, the conductive plug 18a may be disposed on the doped region 18. In some embodiments, the conductive plug 18a and the doped region 18 may form a low resistance ohmic contact.

In some embodiments, the doped region 18 and the active region 13 may be doped with different dopants. For example, the doped region 18 may be a P-doped region, with the active region 13 being an N-doped region. For example, the doped region 18 may be an N-doped region, with the active region 13 being a P-doped region.

In some embodiments, the doped region 18 may be omitted. For example, the conductive plug 18a may be disposed on the active region 13.

In some embodiments, the gate metal layer 15 may be connected or coupled to a voltage Vcc (e.g., a pumped voltage, a programming power voltage, a bias voltage, etc.). In some embodiments, the active region 13 may be grounded or held at the substrate potential. In some embodiments, when the voltage exceeds a threshold value (e.g., a breakdown voltage), the semiconductor device 4 may be activated. For example, a conductive path 14p across the fuse dielectric layer 14 may be formed, thereby causing an open circuit in the semiconductor device 4 to become a short circuit or a relatively low resistance link or node.

It will be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

In some embodiments, the fuse dielectric layer 14 may undergo a dielectric breakdown process or a transformation of properties after the breakdown voltage is applied between the gate metal layer 15 and the active region 13. In some embodiments, the fuse dielectric layer 14 may be damaged. In some embodiments, the lattice structure of the fuse dielectric layer 14 may be changed. In some embodiments, a defect may be formed in the fuse dielectric layer 14. In some embodiments, the gate metal layer 15 and the active region 13 may be electrically connected through the fuse dielectric layer 14. In some embodiments, the conductivity of the fuse dielectric layer 14 may be increased by about 1000 times, by about 10000 times, or more after the breakdown voltage is applied between the gate metal layer 15 and the active region 13. In some embodiments, the resistivity of the fuse dielectric layer 14 may be decreased after the breakdown voltage is applied between the gate metal layer 15 and the active region 13.

It will be understood that the conductive path 14p across the fuse dielectric layer 14 is merely illustrated for a better understanding, and may not be observed when the breakdown voltage is applied.

In some embodiments, since another gate metal layer (such as the gate metal layer 17 shown in FIG. 3) is electrically connected with the gate metal layer 15, the voltage Vcc may be applied to the two gate metal layers 15 and 17.

For example, referring to FIG. 3 and FIG. 4, the voltage Vcc may be applied to the gate metal layer 15 through the conductive layer 21 and the conductive plug 15a. In addition, the voltage Vcc may be applied to the gate metal layer 17 through the conductive layer 21, the conductive plug 15a, the gate metal layer 15, and the conductive layer 23.

In some embodiments, the voltage applied to the gate metal layer 15 and the gate metal layer 17 may be controlled by a voltage controlled switch circuit, which may include, for example, one or more pass gates, one or more select gates, etc. According to some embodiments of the present disclosure, the select gates may be configured to select and control the pass gates. For example, the pass gates may be controlled by a logic signal, which can be output from the select gates.

Please note that the gate metal layer 15 in FIG. 4 may have a profile different from the profile of the gate metal layer 15 in FIG. 1. For example, as shown in FIG. 3, the gate metal layer 15 may extend along the first direction (such as the direction Y). For example, as shown in FIG. 3, the gate metal layer 15 may extend along the isolation structures 11 and 12.

Figure 5:
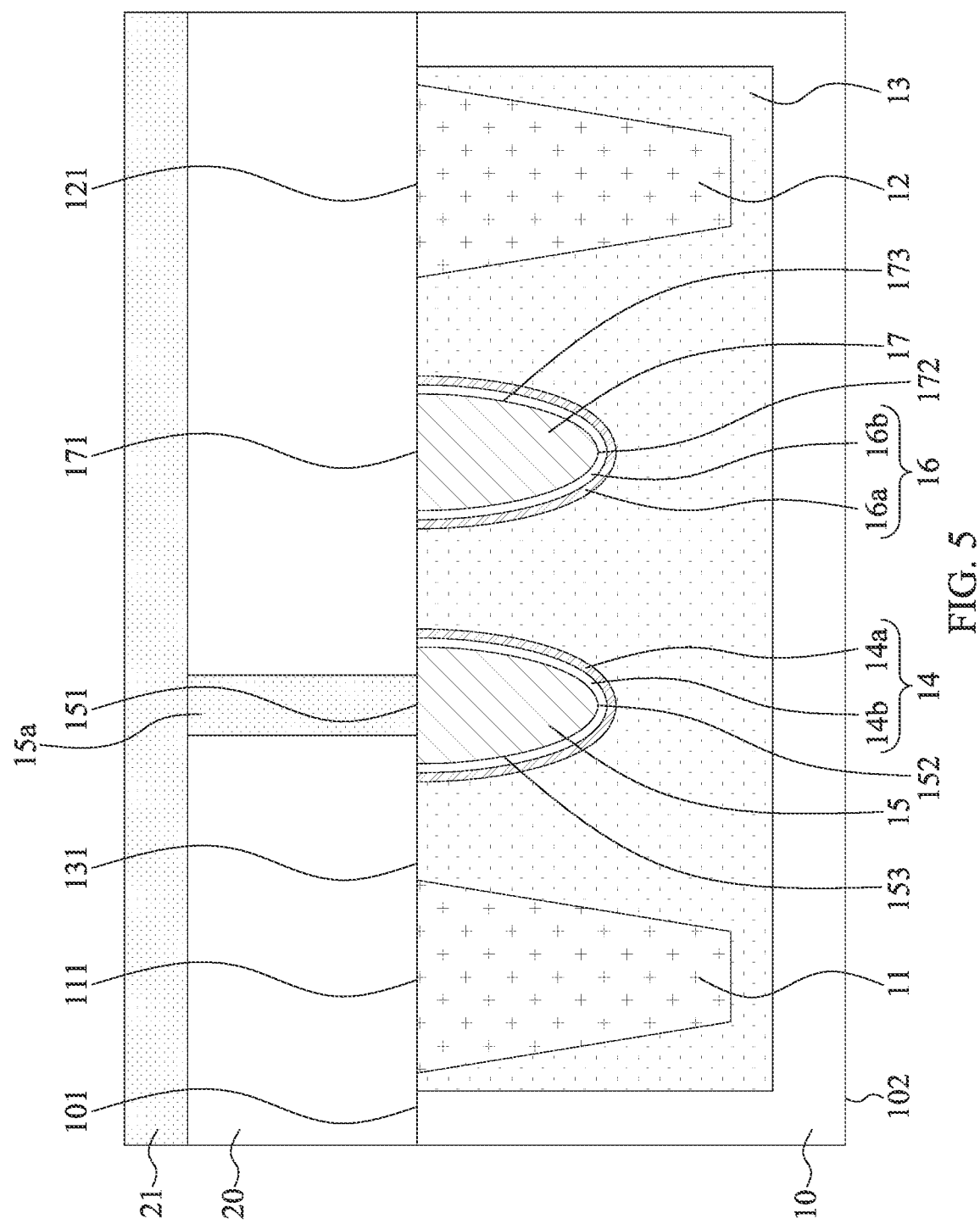
FIG. 5 is a schematic cross-sectional view of a semiconductor device in accordance with some embodiments of the present disclosure.

FIG. 5 is a schematic cross-sectional view of a semiconductor device 5 in accordance with some embodiments of the present disclosure. The semiconductor device 5 of FIG. 5 is similar to the semiconductor device 1 of FIG. 1, except for the differences described below.

In some embodiments, as shown in FIG. 1, the fuse dielectric layer 14 may include a monolayer or a single layer. However, in some other embodiments, as shown in FIG. 5, the fuse dielectric layer 14 may include a plurality of dielectric layers stacked on one another.

For example, in some embodiments, the active region 13 may include a recess indented or recessed into the substrate 10, and the fuse dielectric layers 14a and 14b may be disposed in the recess. In some embodiments, the dielectric layer 14b may be disposed on the dielectric layer 14a. In some embodiments, the dielectric layer 14b may be disposed between the dielectric layer 14a and the gate metal layer 15. In some embodiments, the dielectric layer 14a may be in contact with (such as in direct contact with) the active region 13. In some embodiments, the dielectric layer 14b may be in contact with (such as in direct contact with) gate metal layer 15.

In some embodiments, the dielectric layers 14a and 14b may have the same material but be formed in different operations. In some embodiments, the dielectric layers 14a and 14b may have different materials. In some embodiments, the dielectric layers 14a and 14b may be adjusted to obtain different dielectric break-down characteristics according to some embodiments of the present disclosure.

Similarly, the fuse dielectric layer 16 may include a plurality of dielectric layers stacked on one another. For example, the fuse dielectric layer 16 may include a dielectric layer 16a, and a dielectric layer 16b may be disposed on the dielectric layer 16a.

Figure 6:
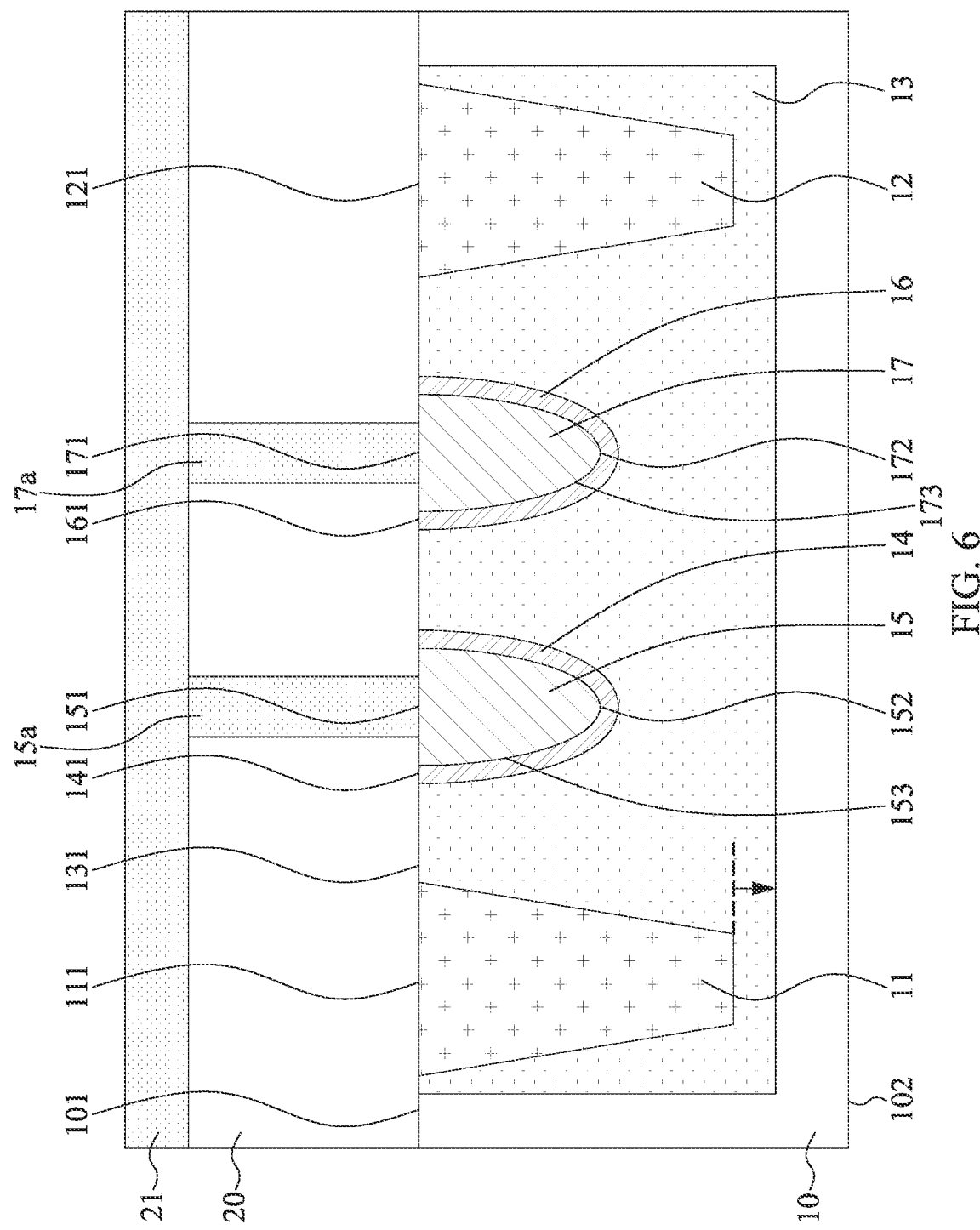
FIG. 6 is a schematic cross-sectional view of a semiconductor device in accordance with some embodiments of the present disclosure.

FIG. 6 is a schematic cross-sectional view of a semiconductor device 6 in accordance with some embodiments of the present disclosure. The semiconductor device 6 of FIG. 6 is similar to the semiconductor device 1 of FIG. 1, except for the differences described below.

The semiconductor device 6 may further include a conductive plug 17a spaced apart from the conductive plug 15a.

In some embodiments, the conductive plug 17a may penetrate or extend into the interlayer dielectric layer 20. In some embodiments, the conductive plug 17a may be disposed on the surface 171 of the gate metal layer 17. In some embodiments, the conductive plug 17a may be in contact with the surface 171 of the gate metal layer 17. For example, a part of the surface 171 of the gate metal layer 17 may be covered by the conductive plug 17a, and another part of the surface 171 of the gate metal layer 17 may be covered by the interlayer dielectric layer 20. In some embodiments, the conductive plug 17a may be electrically connected with the gate metal layer 17.

In some embodiments, the conductive plug 17a may include a suitable conductive material. For example, the conductive plug 17a may include tungsten (W), copper (Cu), aluminum (Al), silver (Ag), an alloy thereof, or a combination thereof.

In some embodiments, the gate metal layer 15 and the gate metal layer 17 may be electrically connected through the conductive plug 15a, the conductive layer 21, and the conductive plug 17a.

Figure 7:
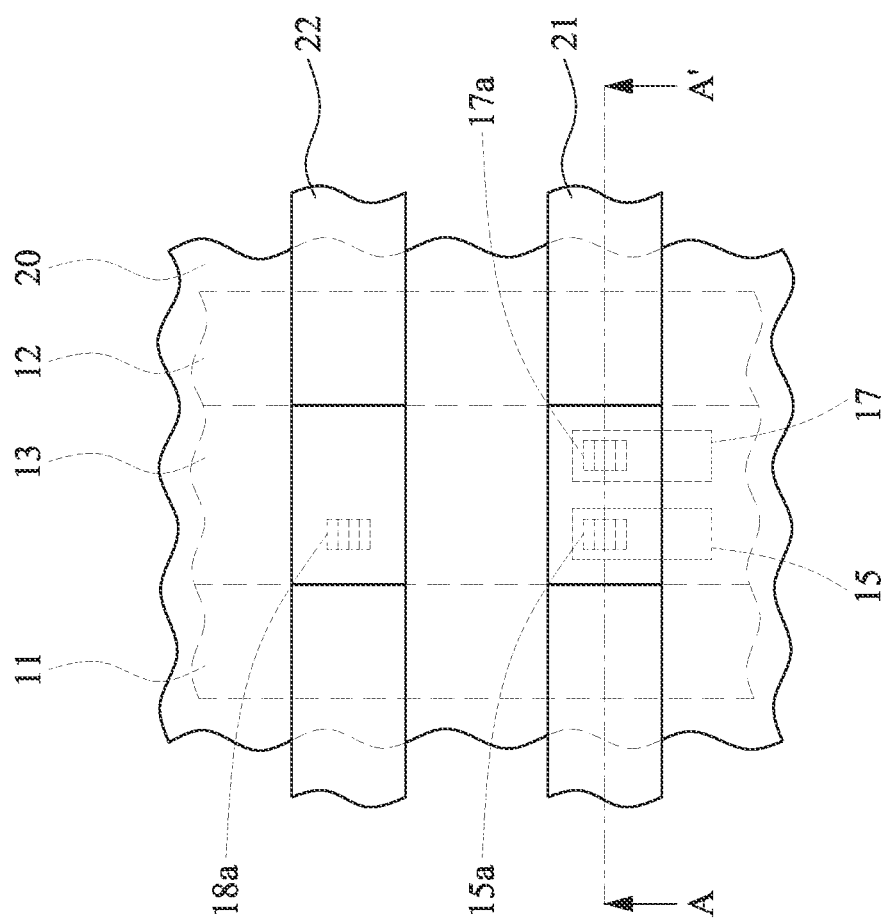
FIG. 7 illustrates a schematic top view of a semiconductor device in accordance with some embodiments of the present disclosure.

FIG. 7 illustrates a schematic top view of a semiconductor device 7 in accordance with some embodiments of the present disclosure. In some embodiments, the semiconductor device 6 of FIG. 6 may be a schematic cross-sectional view cutting through line AA' in FIG. 7. The semiconductor device 7 of FIG. 7 is similar to the semiconductor device 3 of FIG. 3, except for the differences described below.

In FIG. 7, the gate metal layer 15 and the gate metal layer 17 may be electrically connected through the conductive plug 15a, the conductive layer 21, and the conductive plug 17a. Therefore, the conductive layer 23 in FIG. 3 may be omitted.

In some embodiments, the gate metal layer 15 may be electrically connected with the conductive layer 21 through the conductive plug 15a. In some embodiments, the gate metal layer 17 may be electrically connected with the conductive layer 21 through the conductive plug 17a.

In a comparative embodiment, a fuse component may include a metal-oxide-semiconductor structure (i.e., a MOS structure). The MOS structure is a planar structure (or a two-dimensional (2D) structure), in which a planar metal layer and a planar oxide layer are stacked on an active area. Such a planar structure occupies a larger area on the semiconductor substrate. As semiconductor devices become more highly integrated, fuse components with favorable size and breakdown conditions are required.

By forming a fuse component having a three-dimensional (3D) structure, the area occupied by the fuse component of the present disclosure is increasingly reduced. For example, the overlay area between the active region 13 and the gate metal layer 15 may be decreased by more than 40 times, i.e., decreased from about 160 nanometers (nm)*120 nm to about 26 nm*17 nm.

In addition, the overlapping perimeter between the active region 13 and the gate metal layer 15 of the fuse component 1 (or the fuse component 2, the fuse component 3, the fuse component 4, the fuse component 5, the fuse component 6, the fuse component 7) of the present disclosure can be increased without further occupying other areas. The longer overlapping perimeter can reduce the breakdown voltage, and therefore increases the probability of successfully fusing the fuse component 1 of the present disclosure.

In addition, by electrically connecting at least two fuse components (such as electrically connecting the gate metal layer 15 and the gate metal layer 17) of the present disclosure, the probability of successfully fusing the fuse components can be increased.

For example, when a voltage (such as the voltage Vcc in FIG. 4) applied to the gate metal layer 15 and the gate metal layer 17 exceeds a threshold value, at least one of the resistivity of the fuse dielectric layer 14 and the resistivity of the fuse dielectric layer 16 may be changed. For example, at least one of the fuse dielectric layer 14 and the fuse dielectric layer 16 may undergo a dielectric breakdown process.

FIGS. 8A, 8B, 8C, 8D, 8E, and 8F illustrate stages of a method of manufacturing a semiconductor device in accordance with some embodiments of the present disclosure. At least some of these figures have been simplified for a better understanding of the aspects of the present disclosure. In some embodiments, the semiconductor device 1 in FIG. 1 may be manufactured by the operations described below with respect to FIGS. 8A, 8B, 8C, 8D, 8E, and 8F.

Figure 8A:
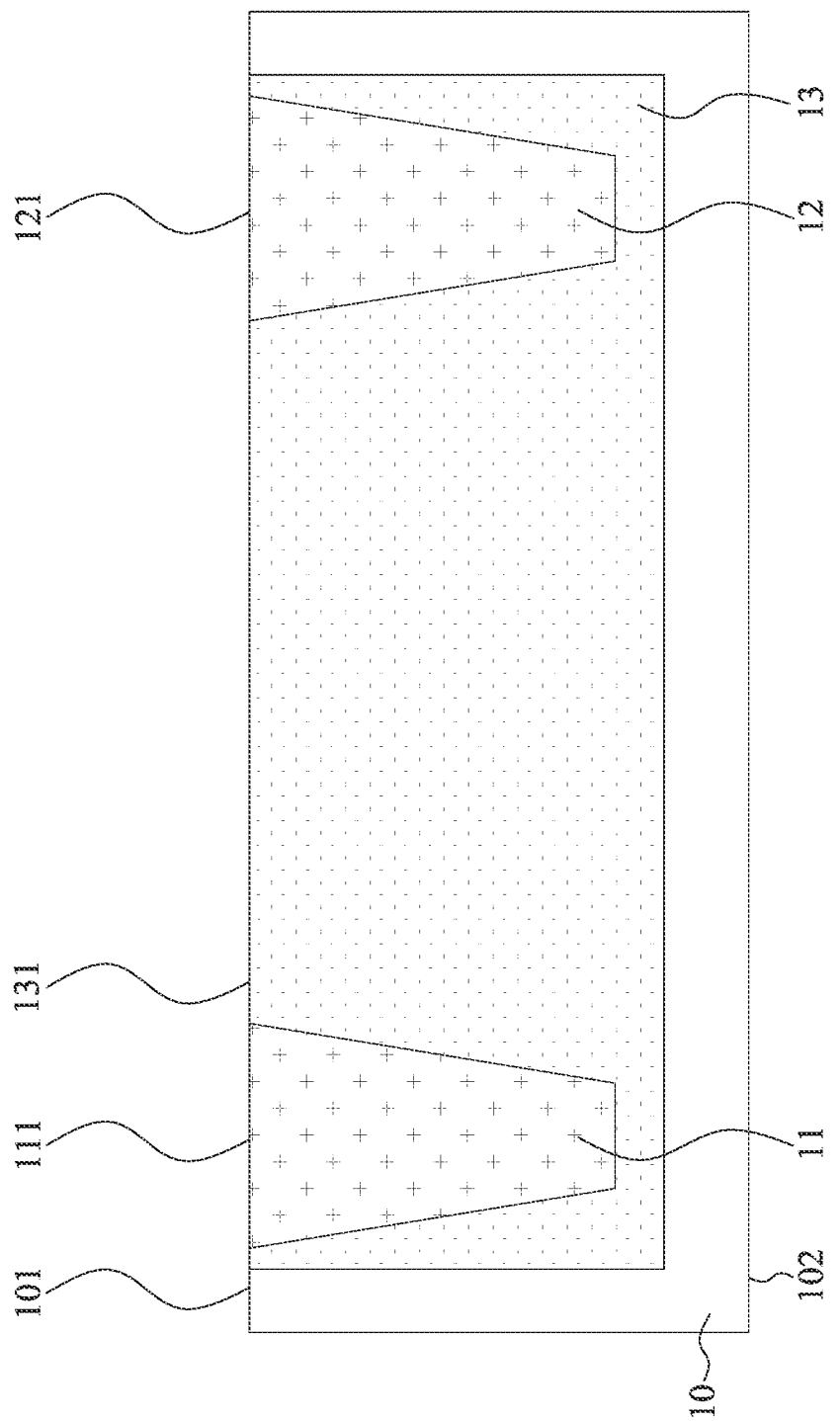
FIG. 8A illustrates one or more stages of a method of manufacturing a semiconductor device in accordance with some embodiments of the present disclosure.

Referring to FIG. 8A, the substrate 10 may be provided. The isolation structures 11 and 12 may be disposed over or in the substrate 10. The active region 13 may be defined by the isolation structures 11 and 12. In some embodiments, the isolation structures 11 and 12 may be formed by trench etching followed by filling the trench with a dielectric material. In some embodiments, the active region 13 may be formed by doping impurities through ion-implantation or thermal diffusion. In some embodiments, the active region 13 may be formed over or proximal to the surface 101 of the substrate 10. In some embodiments, the active region 13 may be formed after the formation of the isolation structures 11 and 12. In some other embodiments, the active region 13 may be formed before the formation of the isolation structures 11 and 12.

Figure 8B:
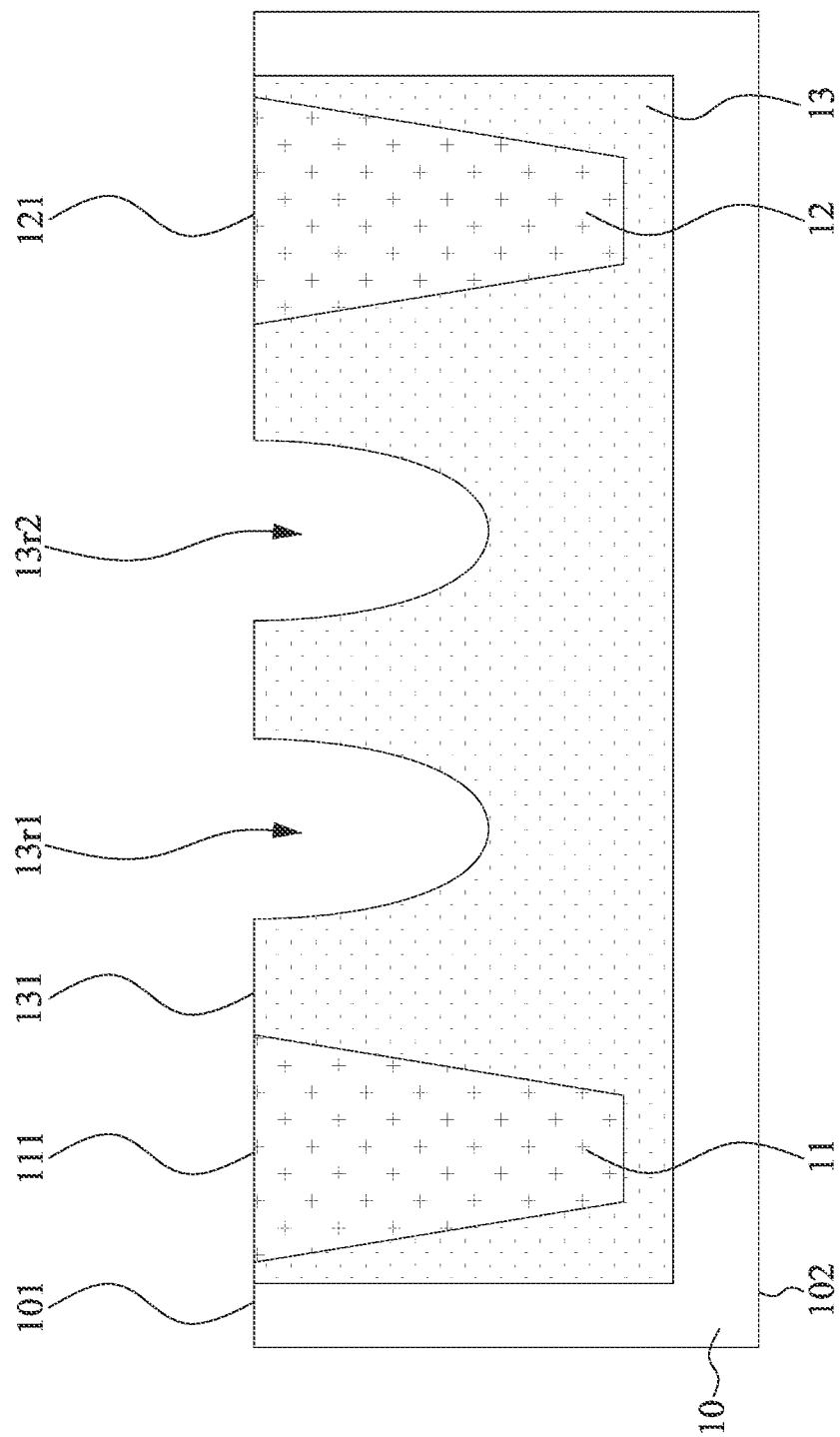
FIG. 8B illustrates one or more stages of a method of manufacturing a semiconductor device in accordance with some embodiments of the present disclosure.

Referring to FIG. 8B, a recess regions 13r1 and 13r2 may be formed in the active region 13. In some embodiments, the recess regions 13r1 and 13r2 may be formed by lithography and etching techniques. In some embodiments, the recess regions 13r1 and 13r2 may each have a depth shallower than that of the active region 13. In some embodiments, the recess regions 13r1 and 13r2 may each have a depth shallower than that of the isolation structures 11 and 12. In some embodiments, the recess region 13r1 may be formed in a way such that the substrate 10 is not exposed through the recess region 13r1. In some embodiments, the recess region 13r2 may be formed in a way such that the substrate 10 is not exposed through the recess region 13r2.

Figure 8C:
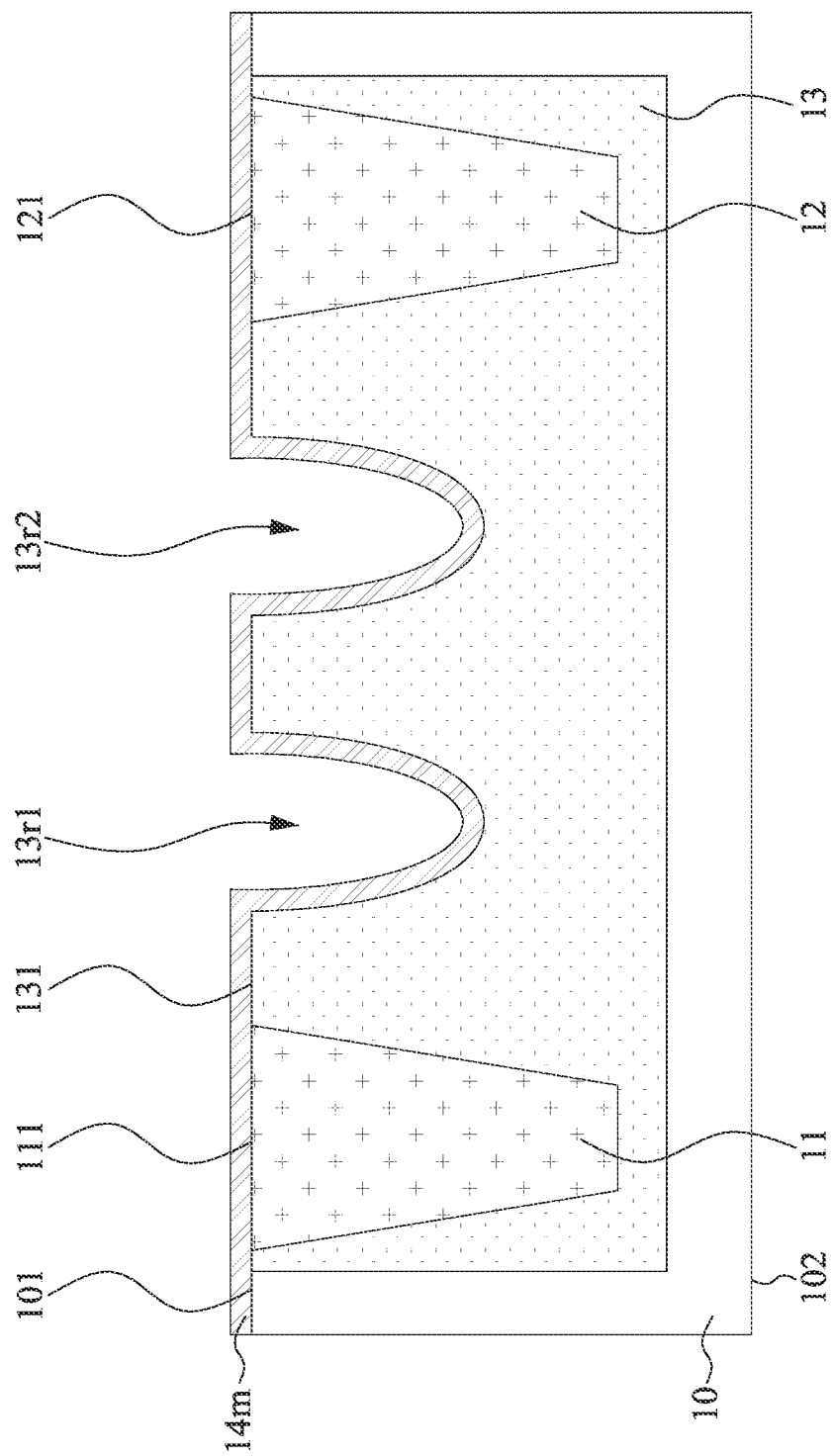
FIG. 8C illustrates one or more stages of a method of manufacturing a semiconductor device in accordance with some embodiments of the present disclosure.

Referring to FIG. 8C, a fuse dielectric material 14m may be disposed in the recess regions 13r1 and 13r2 in the active region 13. In some embodiments, the fuse dielectric material 14m may be formed by a thermal oxidation operation. In some embodiments, the fuse dielectric material 14m may be formed by an atomic layer deposition (ALD) process, a chemical vapor deposition (CVD) process, or a combination thereof. For example, the fuse dielectric material 14m may be formed by forming a layer through an ALD process, then forming another layer through a CVD process. In some embodiments, the fuse dielectric material 14m may be disposed on the surface 131 of the active region 13, the surface 121 of the isolation structure 12, the surface 111 of the isolation structure 11, and/or the surface 101 of the substrate 10.

Figure 8D:
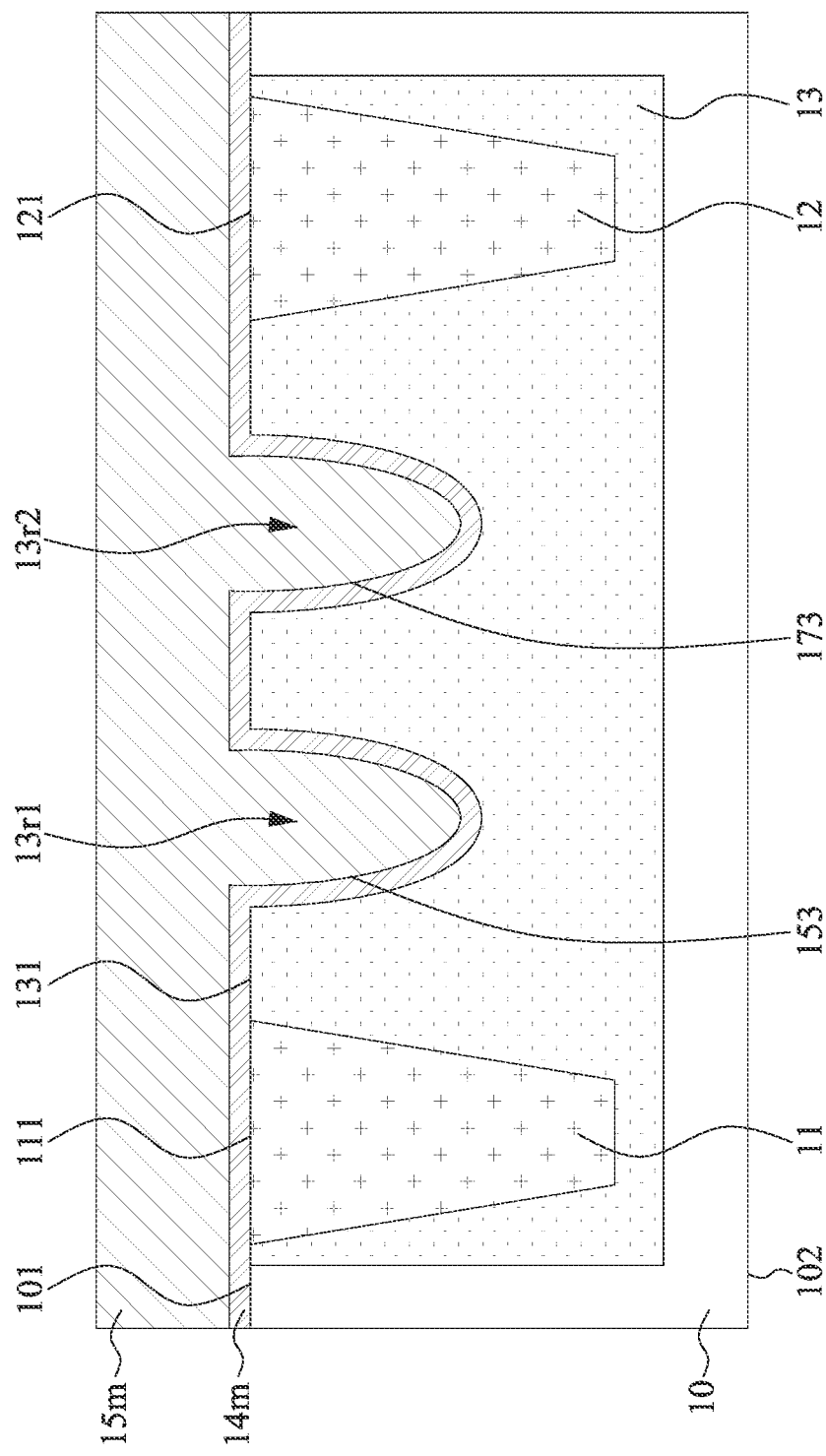
FIG. 8D illustrates one or more stages of a method of manufacturing a semiconductor device in accordance with some embodiments of the present disclosure.

Referring to FIG. 8D, a gate metal material 15m may be disposed to fill the recess regions 13r1 and 13r2 in the active region 13 by, for example, CVD, low pressure chemical vapor deposition (LPCVD). The surface 153 of the gate metal material 15m in the recess region 130 may be non-parallel to or angled with the surface 101 of the substrate 10. In some embodiments, the surface 153 may be surrounded by the fuse dielectric material 14m. The surface 173 of the gate metal material 15m in the recess region 13r2 may be non-parallel to or angled with the surface 101 of the substrate 10. In some embodiments, the surface 173 may be surrounded by the fuse dielectric material 14m.

Figure 8E:
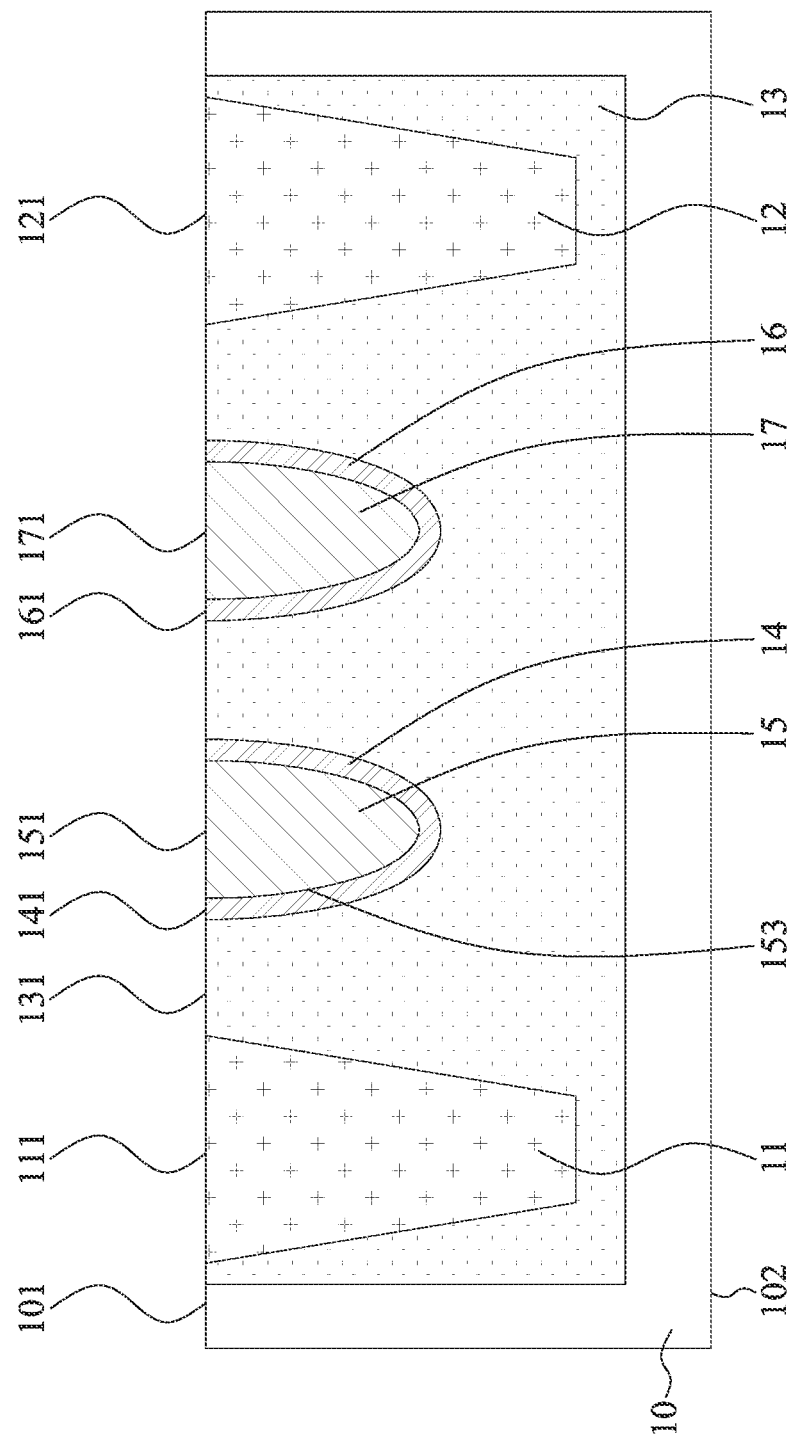
FIG. 8E illustrates one or more stages of a method of manufacturing a semiconductor device in accordance with some embodiments of the present disclosure.

Referring to FIG. 8E, a planarization operation, such as a chemical-mechanical polishing (CMP) operation, may be performed. After the planarization operation, the gate metal layers 15 and 17, and the fuse dielectric layers 14 and 16 may be formed. The gate metal layer 15 may be spaced apart from the gate metal layer 17. For example, the gate metal layer 15 may be physically separated from the gate metal layer 17. The fuse dielectric layer 14 may be spaced apart from the fuse dielectric layer 16. For example, the fuse dielectric layer 14 may be physically separated from the fuse dielectric layer 16.

The surface 151 of the gate metal layer 15, the surface 141 of the fuse dielectric layer 14, the surface 171 of the gate metal layer 17, the surface 161 of the fuse dielectric layer 16, the surface 131 of the active region 13, the surface 121 of the isolation structure 12, the surface 111 of the isolation structure 11, and/or the surface 101 of the substrate 10 may be substantially coplanar.

Figure 8F:
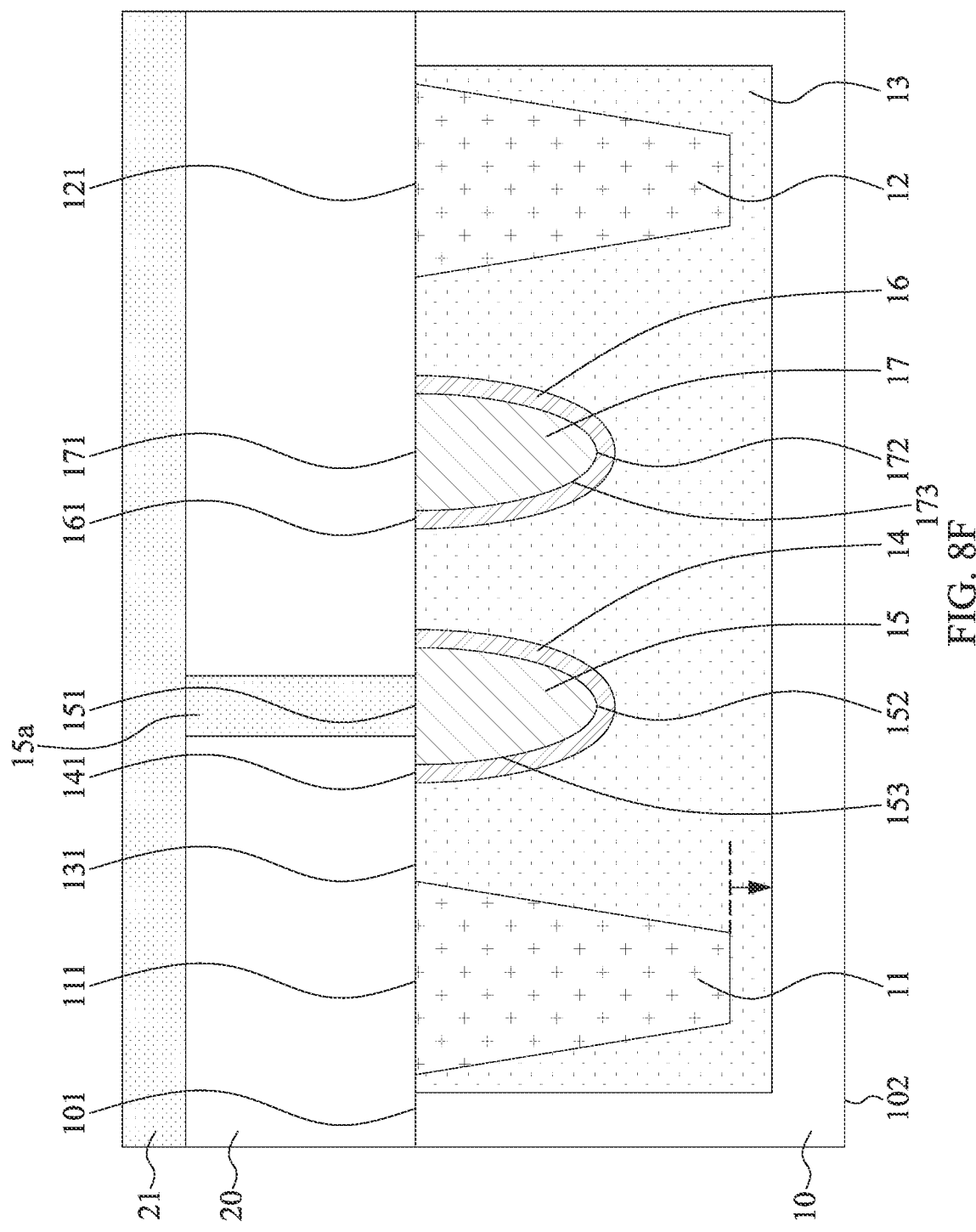
FIG. 8F illustrates one or more stages of a method of manufacturing a semiconductor device in accordance with some embodiments of the present disclosure.

Referring to FIG. 8F, the interlayer dielectric layer 20 may be disposed by, for example, ALD, CVD, physical vapor deposition (PVD), remote plasma CVD (RPCVD), plasma enhanced CVD (PECVD), coating, etc. An opening may be formed in the interlayer dielectric layer 20 by lithography and etching techniques. A conductive material of the conductive plug 15a may be formed in the opening in the interlayer dielectric layer 20. The conductive material may be formed by suitable techniques such as electroplating, or an electroless plating process, CVD, PVD, etc.

Similar operations may be repeated to form other conductive elements. For example, in some embodiments, a conductive layer (such as the conductive layer 23 in FIG. 3) may be formed to electrically connect the gate metal layer 15 and the gate metal layer 17.

Similar operations may be repeated to form the conductive layer 21 and other conductive elements (if any) over the conductive plug 15a.

In some embodiments, the method may further include connecting the gate metal layer 15 and the gate metal layer 17 to a power supply so as to apply a voltage to the gate metal layer 15 and the gate metal layer 17 to cause an open circuit in the semiconductor device to become a short circuit or a relatively low resistance link or node. For example, when a voltage (such as the voltage Vcc in FIG. 4) applied to the gate metal layer 15 and the gate metal layer 17 exceeds a threshold value, at least one of the resistivity of the fuse dielectric layer 14 and the resistivity of the fuse dielectric layer 16 may be changed. For example, at least one of the fuse dielectric layer 14 and the fuse dielectric layer 16 may undergo a dielectric breakdown process.

In some embodiments, the operations described with respect to FIGS. 8A, 8B, 8C, 8D, 8E, and 8F may be performed concurrently during a manufacturing process of, for example, a buried-gate structure of an adjacent circuit. For example, the recess regions 13r1 and 13r2 may be formed during a manufacturing process of, for example, a gate trench. For example, the fuse dielectric layers 14 and 16 may be formed during a manufacturing process of, for example, a gate dielectric layer of a buried-gate structure. For example, the gate metal layers 15 and 17 may be formed during a manufacturing process of, for example, a gate electrode of a buried-gate structure.

Figure 9:
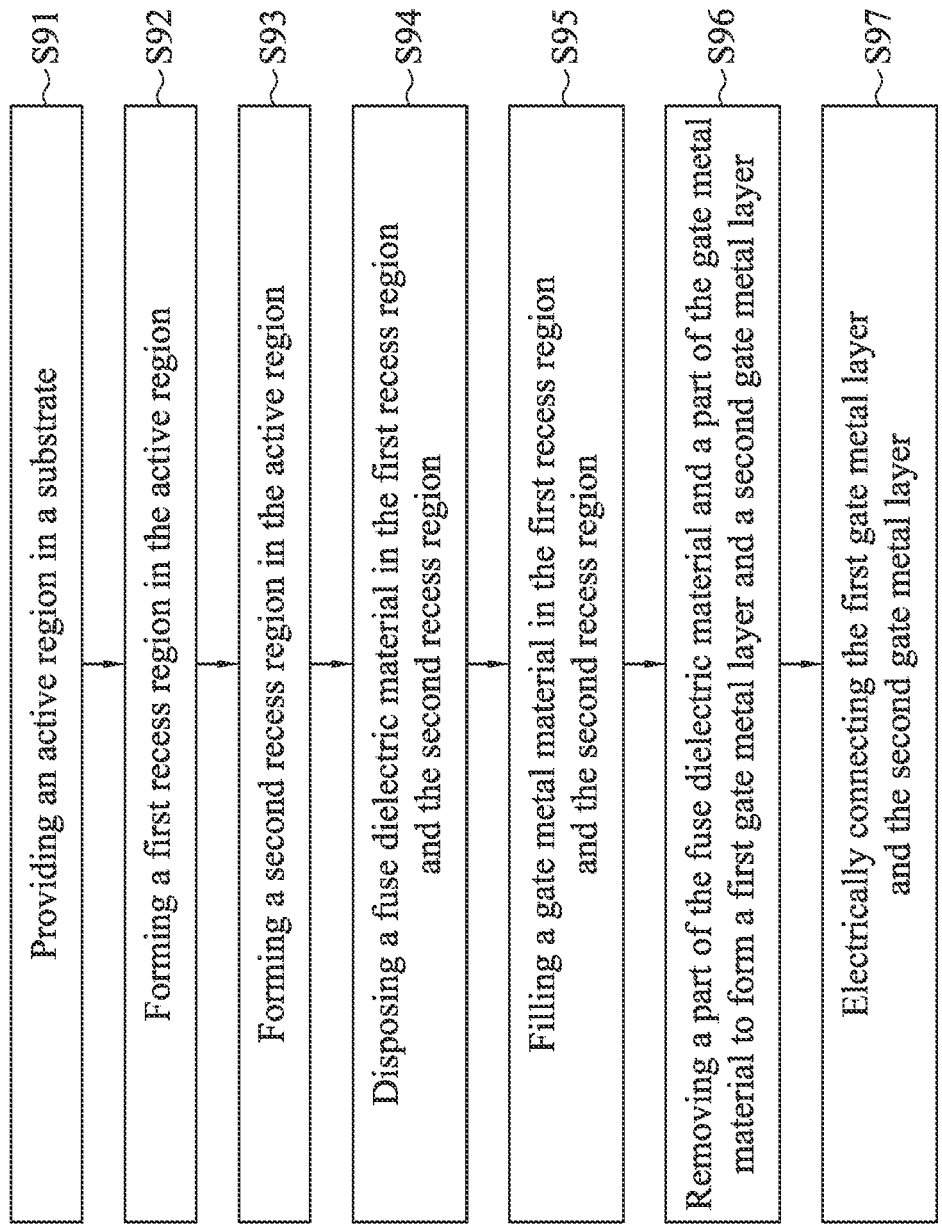
FIG. 9 illustrates a flow chart of a method of manufacturing a semiconductor device in accordance with some embodiments of the present disclosure.

FIG. 9 illustrates a flow chart of a method 90 of manufacturing a semiconductor device in accordance with some embodiments of the present disclosure.

In some embodiments, the method 90 may include a step S91, providing an active region in a substrate. For example, as shown in FIG. 8A, the substrate 10 having the active region 13 disposed over or proximal to the surface 101 of the substrate 10 may be provided.

In some embodiments, the method 90 may include a step S92, forming a first recess region in the active region. In some embodiments, the method 90 may include a step S93, forming a second recess region in the active region. For example, as shown in FIG. 8B, the recess regions 13r1 and the recess 13r2 may be formed in the active region 13.

In some embodiments, the step S92 and the step S93 may be performed in the same operation. In some embodiments, the step S92 and the step S93 may be performed sequentially or in parallel.

In some embodiments, the method 90 may include a step S94, disposing a fuse dielectric layer in the first recess region and the second recess region. For example, as shown in FIG. 8C, the fuse dielectric material 14m may be disposed in the recess regions 13r1 and 13r2 in the active region 13.

In some embodiments, the method 90 may include a step S95, filling a gate metal material in the first recess region and the second recess region. For example, as shown in FIG. 8D, the gate metal material 15m may be disposed to fill the recess regions 13r1 and 13r2 in the active region 13.

In some embodiments, the method 90 may include a step S96, removing a part of the fuse dielectric layer and a part of the gate metal material to form a first gate metal layer and a second gate metal layer. For example, as shown in FIG. 8E, the fuse dielectric material 14m and the gate metal material 15m may be partially removed. Therefore, the gate metal layers 15 and 17, and the fuse dielectric layers 14 and 16 may be formed.

In some embodiments, the method 90 may include a step S97, electrically connecting the first gate metal layer and the second gate metal layer. For example, as shown in FIG. 8F, the interlayer dielectric layer 20 and the conductive material of the conductive plug 15a may be formed. Other conductive elements may be formed to electrically the gate metal layer 15 and the gate metal layer 17 to the conductive plug 15a.

One aspect of the present disclosure provides a fuse component. The fuse component includes an active region having a surface, a first fuse dielectric layer extending from the surface of the active region into the active region, a first gate metal layer surrounded by the first fuse dielectric layer, a second fuse dielectric layer extending from the surface of the active region into the active region, and a second gate metal layer surrounded by the second fuse dielectric layer. The first gate metal layer is electrically connected with the second gate metal layer.

Another aspect of the present disclosure provides a semiconductor device. The semiconductor device includes an active region, a first fuse dielectric layer disposed in the active region, a first gate metal layer disposed in the active region and surrounded by the first fuse dielectric layer, a second fuse dielectric layer disposed in the active region, and a second gate metal layer disposed in the active region and surrounded by the second fuse dielectric layer. The first gate metal layer and the second gate metal layer are configured to receive a voltage to change a resistivity between the first gate metal layer and the active region.

Another aspect of the present disclosure provides a method of manufacturing a fuse component. The method includes providing an active region, forming a first recess region and a second recess region in the active region, disposing a fuse dielectric material in the first recess region and the second recess region, and filling the first recess region and the second recess region with a gate metal material.

By forming a fuse component having a three-dimensional (3D) structure, the area consumption of the fuse component of the present disclosure is increasingly reduced. In addition, by electrically connecting at least two fuse components of the present disclosure, the probability of successfully fusing the fuse components can be increased.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A fuse component, comprising:
   an active region having a surface;
   a first fuse dielectric layer extending from the surface of the active region into the active region; and
   a first gate metal layer surrounded by the first fuse dielectric layer;
   a second fuse dielectric layer extending from the surface of the active region into the active region; and
   a second gate metal layer surrounded by the second fuse dielectric layer; and
   a first conductive layer coupled with the first gate metal layer and the second gate metal layer, wherein the first gate metal layer is electrically connected with the second gate metal layer;
   wherein the first gate metal layer and the second gate metal layer each have a width and a length greater than the width, the length of each of first gate metal layer and the second gate metal layer extending along a first direction, while the first conductive layer extends from the first gate metal layer to the second gate metal layer along a second direction not parallel to the first direction,
   wherein the first gate metal layer and the second gate metal layer extend onto the active region along a third direction perpendicular to the first direction and the second direction, respectively, and wherein the active region, the first fuse dielectric layer, and the first gate metal layer form a first antifuse and the active region, the second fuse dielectric layer, and the second gate metal layer form a second antifuse.

2. The fuse component of claim 1, wherein the first fuse dielectric layer is spaced apart from the second fuse dielectric layer.

3. The fuse component of claim 2, wherein the first fuse dielectric layer is separated from the second fuse dielectric layer by the active region.

4. The fuse component of claim 1, further comprising:
a first conductive plug disposed over the first gate metal layer, wherein the first conductive plug is electrically connected with the first gate metal layer and a second conductive layer.

5. The fuse component of claim 4, wherein the second conductive layer is spaced apart from the first conductive layer.

6. The fuse component of claim 2, wherein the first gate metal layer has a lateral surface angled with the surface of the active region and contacting the first fuse dielectric layer.

7. The fuse component of claim 6, wherein the second gate metal layer has a lateral surface angled with the surface of the active region and contacting the second fuse dielectric layer.

8. The fuse component of claim 2, wherein the first gate metal layer comprises a top surface substantially coplanar with the surface of the active region.

9. The fuse component of claim 8, wherein the second gate metal layer comprises a top surface substantially coplanar with the surface of the active region.

10. The fuse component of claim 1, wherein the first fuse dielectric layer comprises a top surface exposed from the active region and substantially coplanar with the surface of the active region.

11. The fuse component of claim 1, further comprising a substrate surrounding the active region, wherein a top surface of the substrate is substantially coplanar with the surface of the active region.

12. The fuse component of claim 1, wherein a doping concentration of the active region between the first fuse dielectric layer and the second fuse dielectric layer is substantially uniform.

13. The fuse component of claim 1, further comprising:
an isolation structure within the active region, wherein a doping concentration of the active region between the isolation structure and the first fuse dielectric layer is substantially uniform.

* * * * *